United States Patent [19]

Wilharm et al.

[11] Patent Number: 5,008,362

[45] Date of Patent: Apr. 16, 1991

[54] BINDERS SOLUBLE IN AQUEOUS ALKALI AND CONTAINING SILANYL GROUPS IN THE SIDE CHAIN, PROCESS FOR PREPARING SAME AND ALSO PHOTOSENSITIVE MIXTURE CONTAINING THESE COMPOUNDS

[75] Inventors: Peter Wilharm, Wiesbaden; Gerhard Buhr, Koenigstein; Juergen Fuchs, Floersheim-Wicker, all of Fed. Rep. of Germany

[73] Assignee: Hoechst Aktiengesellschaft, Frankfurt am Main, Fed. Rep. of Germany

[21] Appl. No.: 332,511

[22] Filed: Apr. 3, 1989

[30] Foreign Application Priority Data

Apr. 2, 1988 [DE] Fed. Rep. of Germany ....... 3811242

[51] Int. Cl.$^5$ ............................................. C08G 77/04
[52] U.S. Cl. ..................... 528/28; 525/100; 525/102; 525/106; 525/398; 525/415; 525/440; 525/446; 525/487; 525/523; 528/29; 528/30; 528/32; 528/33; 528/34; 528/35; 528/36; 528/57; 430/175; 430/192; 430/197; 430/270
[58] Field of Search ............ 528/33, 34, 35, 36, 528/37, 28, 29, 30, 32; 430/192, 197, 175, 270; 525/100, 398, 415, 440, 446, 487, 523, 102, 106

[56] References Cited

U.S. PATENT DOCUMENTS

| | | | |
|---|---|---|---|
| 4,189,320 | 2/1980 | Hsich | 430/192 |
| 4,387,151 | 6/1983 | Bosse et al. | 430/175 |
| 4,464,455 | 8/1984 | Yoneda et al. | 430/270 |
| 4,481,049 | 11/1984 | Reichmanis et al. | 156/643 |
| 4,481,279 | 11/1984 | Naito et al. | 430/280 |
| 4,544,729 | 10/1985 | Nate et al. | 528/28 |
| 4,624,909 | 11/1986 | Saotome et al. | 430/192 |
| 4,689,288 | 8/1987 | Buiguez et al. | 430/270 |
| 4,794,153 | 12/1988 | Rich | 528/26 |
| 4,803,147 | 2/1989 | Mueller et al. | 430/288 |
| 4,812,200 | 3/1989 | Birkle et al. | 156/643 |
| 4,845,183 | 7/1989 | Mueller et al. | 430/269 |
| 4,923,949 | 5/1990 | Iwahara et al. | 528/33 |

FOREIGN PATENT DOCUMENTS

| | | |
|---|---|---|
| 1024803 | 3/1974 | Canada ............... 430/175 |
| 0129834 | 1/1985 | European Pat. Off. . |
| 0231497 | 8/1987 | European Pat. Off. . |
| 0232167 | 8/1987 | European Pat. Off. . |
| 62-256804 | 11/1987 | Japan . |
| 2158450A | 11/1985 | United Kingdom . |

OTHER PUBLICATIONS

Patent Abstract, HITE, G06, 87-153399/22, J62089-95-5-A, 4/1987.
Patent Abstract, 83-792423/42, G06 A89 L03 P83, HITA 10.03.82, J 5 8153-931-A, 9/1983.
Patent Abstract, HITA, G06, 85-002102/01, J5 9061-831 A, 4/1984.
Patent Abstract, HITA, G06, 85-052484/09, J6 0008-839-A, 1/1985.
Patent Abstract, HITA, G06, 86-186160/29, J6 1118-745-A, 6/1986.
Patent Abstract, HITA, G06, 86-261588/40, J61189-533-A, 8/1986.
Patent Abstract, HITA, G06, 87-070526/10, J6 2025-744-A, 2/1987.
Patent Abstract, NIDE, G06, 87-254666/36, J62177-005-A, 8/1987.
Patent Abstract, OKID, G06, 87-003963/01, J6 1264-342-A, 11/1986.
Patent Abstract, FUIT, G06, 84-216055/35, J5 9125-729-A, 7/1984.
Patent Abstract, FUIT, G06, 84-216056/35, J5 9125-730-A, 7/1984.
Patent Abstract, FUIT, G06, 84-209630/34, J5 9121-042-A, 7/1984.
Patent Abstract, 83-791994/42, G06 A26 E11, HITA 05.03.82, J5 8152-892-A, 9/1983.
Patent Abstract, HITA, G02, 87-083488/12, J6 2034-923-A, 2/1987.
English Language Abstract of Japanese Publication, #62-177005, Published Aug. 3, 1987.

*Primary Examiner*—Charles L. Bowers, Jr.
*Attorney, Agent, or Firm*—Foley & Lardner

[57] ABSTRACT

A silylated polymeric binder, which is soluble or swellable in alkali, bears a plurality of at least one of aliphatic and aromatic hydroxyl groups, at least a portion of which are derivatized by units of the formula I and II:

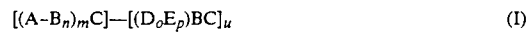

$$[(A-B_n)_mC]—[(D_oE_p)BC]_u \qquad (I)$$

and

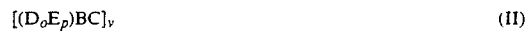

$$[(D_oE_p)BC]_v \qquad (II)$$

which are side chains of the polymeric binder, wherein

A denotes a silanyl group containing at least 2 silicon atoms in total linked to each other, but not more than 3 silicon atoms linked to each other in an unbranched chain or silicon atoms;

B denotes a bridging group;

C denotes a functional group which has formed a covalent bond with an aromatic, aliphatic, or cycloaliphatic hydroxyl group of the binder, the group D, or the group E;

D denotes a grafted monohydric or polyhydric aliphatic alcohol;

E denotes a grafted monohydric or polyhydric aromatic alcohol;

n denotes 0 or 1;

m denotes 1 or 2; and o, p, u and v each denote 0 or 1.

Photosensitive mixtures containing this binder are resistant to plasma etching, stable on storage and having a high thermal stability.

23 Claims, No Drawings

BINDERS SOLUBLE IN AQUEOUS ALKALI AND CONTAINING SILANYL GROUPS IN THE SIDE CHAIN, PROCESS FOR PREPARING SAME AND ALSO PHOTOSENSITIVE MIXTURE CONTAINING THESE COMPOUNDS

BACKGROUND OF THE INVENTION

This invention relates to silylated binders which are soluble in aqueous alkali and which carry silanyl groups in the side chain, a process for preparing same and also positive and negative-working photosensitive mixtures containing said binders.

In the submicron region, in particular, with increasing resolution and at the same time decreasing focussing tolerance for structuring substrates with complicated topography, microlithography requires the use of multi-layer systems. The two-layer system is preferred because of simpler processability.

Usually the substrate has a complicated topography which is due to process steps which are standard in the manufacture of microelectronic circuits such as, for example, metallization, oxide deposition, epitaxy, etc.

In the two-layer process, the topographically uneven substrate is leveled by a so-called planarization layer. As materials for the planarization layer, use is typically made of polymers which can be satisfactorily etched in the subsequent plasma etching process.

The actual resist layer, which is exposed through an image, is applied to the planarization layer. After the development of the exposed or unexposed regions (depending on the process used, i.e., positive- or negative-working), the resist layer which has not been removed acts as a mask for plasma etching the planarization layer thereunder which is now not covered by the image. The resist layer must therefore be resistant to plasma etching, in particular to oxygen plasmas, and at the same time must make highly resolved structures possible. The preparation of highly resolved structures by means of multi-layer processes, in particular two-layer processes, is described in detail by E. Reichmanis, G. Smolinsky and C. W. Wilkins in Solid State Technology, August 1985, page 130. Photosensitive layers on planarization layers are reviewed by Y. Onishi et al. in SPIE, vol. 539, Advances in Resist Technology and Processing II, page 62.

The resistance of binders to plasma etching, in particular the resistance to oxygen plasmas, can be achieved by incorporating metal atoms (for example Si, Ge, Sn, Ti). In practice, the use of silicon has proved successful: silicon-containing compounds are relatively readily accessible synthetically, have in general a low toxicity and do not represent a source of contamination in processes for manufacturing microelectronic circuits. Hitherto known silicon-containing binders which contain polysiloxane groups bound to conventional binders are described in U.S. Pat. No. 4,481,049. Photocuring polyorganosiloxanes for coating semiconductors are described in JP-A-590313/1982; photosensitive polyorganosiloxanes with terminal amino groups are described in JP-A-089955/1987. Polymers having a complicated polysilsesquioxane structure are described in EP-A-0,232,167, and polysiloxanes of complicated structure which are difficult to synthesize are also mentioned in EP-A-0,231,497.

Binders of this type, however, have too low a glass transition temperature so that it is not possible to prevent the resist structures flowing under thermal load, such as may occur, for example, in plasma etching processes. As a consequence thereof, it is not possible to prevent a loss of dimensional stability. Binders of this type are also incompatible with other binders, in particular with alkali-soluble binders. In addition, their low lithographic sensitivity and the restriction to irradiation wavelengths in the deep UV light range are disadvantageous.

A polysiloxane which contains disilane units is described by M. Ishikawa et al. in J. Polym. Sci. 21, page 657 (1983). Added to the known low glass transition temperature of polymers containing Si—O—Si groups is, in the case of this compound, also an elaborate synthesis of the silicon-containing monomers necessary for these compounds. Investigations on the photolysis of compounds containing siloxane groups are reported by M. Ishikawa in "Polym. Prepr. ACS", Polymer Chem. 28, 426 (1987).

Furthermore, polymers are known which have polysilane groups as a constituent of the main chain and which contain two to six Si atoms linked to each other (EP-A-0,129,834, JP-A-153931/1983, JP-A-061831/1984, JP-A-008839/1985, JP-A-118745/1986, JP-A-189533/1986 and JP-A-025744/1987). Although compounds of this type are resistant to reactive oxygen-ion etching, they are at the same time active as chromophores towards deep UV light, i.e., they can be cleaved by light of these wavelengths. This makes them disadvantageous for use in photosensitive mixtures: the irradiation wavelengths are restricted to the deep UV region and are consequently not usable in the current I- and H-line exposure equipment employed for mass production. A further disadvantage is the difficulty of synthesizing these compounds, since alkali-metals have to be used in a highly reactive form. At the same time, there is no immediate guarantee that polymers will be produced which are soluble in aqueous alkali. This would entail development of a solvent, which is not considered feasible due to environmental protection standards. In addition, they are not compatible with cresol-formaldehyde-novolak resins since mixtures of these components immediately separate before they are able to form a uniform film on the base (substrate), or on the planarization layer.

Binders for photosensitive mixtures which contain mono-silane groups (—$SiR_3$) are described in EP-A-0,096,596. Disadvantages of the compounds of this type are, inter alia, a complicated monomer and also polymer synthesis. By introducing only one silicon atom per monomer unit, it is possible to achieve the silicon content of the binders required as a minimum for an appropriate resistance to plasma etching only with difficulty, if at all. A serious disadvantage is that these binders permit image differentiation only when developed with organic solvents.

DE-A-2,217,744 describes polymeric binders which also contain —$SiR_3$- groups, but in this case are produced by a polymer-like reaction of polymeric binders with reactive silicon-containing compounds, or by copolymerization. Whether these compounds are resistant to plasma etching is not evident from this publication, but they are claimed to improve the adhesion to substrates. Due to the chemical reactivity of Si-X bonds, the storage life of these compounds is very limited and under certain circumstances a post-curing is possible.

Binders carrying methylene-linked Si fragments are described as constituents of resist systems in JP-A-

177005/1987. The compounds of this type, however, can only be prepared by means of a multi-stage and elaborate synthesis.

Si-containing binders in which the phenolic hydroxyl functions are linked to silicon via ester or iminoester functions are described in JP-A-264342/1986. A disadvantage is, however, that the silicon-ester or silicon-iminoester units described may also be decomposed at the wavelengths used for the photolysis of the naphthoquinonediazides or benzoquinonediazides added, and are split off. A further disadvantage of the compounds cited is their chemical instability towards, for example, hydrolytic decomposition, which has an unfavorable effect on the storage stability. It is furthermore disadvantageous that the multi-stage synthesis of the compounds cited is difficult to reproduce and proceeds with low overall yields.

Binders to which monomers are added, containing disilanyl units to impart resistance to plasma etching to the host polymer, are described in U.S. Pat. Nos. 4,481,279 and 4,464,455, as are similar compounds in JP-A-125729/1984, 125730/1984 and 121042/1984. The disilanyl compounds added to the binder are anchored in the polymer matrix by ionizing radiation. Before the development step by means of reactive ion etching using oxygen, the disilane is removed from the unexposed region, for example with the aid of a vacuum process. The disadvantages of the process are, inter alia, that the differentiation in terms of image is unsatisfactory because silicon-containing monomers are still present in the unexposed regions and these can be removed only inadequately even by the above-mentioned vacuum process.

Polymers containing repeating disilanyl units bound to alkylene or arylene via alkynylene groups are described in JP-A-152892/1982 and JP-A-034923/1987. Disadvantages of the compounds of this type are a complicated binder preparation process and also the chemical instability of the —Si—C≡C— bonds contained in the compounds. Under certain circumstances, a self-development of photosensitive systems which contain these binders is observed.

α-Methylenestyrene polymers which contain a propenyl group bound via a disilanyl group in the para position are described in JP-A-256804/1987. If polymerization initiators are added, these compounds can be used as negative-working photosensitive systems, the styrene polymers crosslinking via the unsaturated groups upon exposure to light. The polymers finally produced no longer carry the disilanyl units as side groups, but the disilanyl units are constituents of the polymer chain itself.

There presently exists a need for a binder with the following properties: solubility in aqueous alkali, resistance to reactive oxygen-ion etching, high storage and thermal stability, and the ability to be employed in photosensitive mixtures without degradation when used in the current I- and H-line exposure equipment.

OBJECTS OF THE INVENTION

It is therefore an object of the present invention to provide a binder which is soluble, but at least swellable, in aqueous alkali.

It is a further object of the invention to provide a photosensitive mixture containing the claimed binder which will adequately resist plasma etching in relation to reactive ion etching, in particular with oxygen.

Another object of the invention is to provide a binder which will ensure high stability and a long storage life for a photosensitive mixture.

Still another object is to provide a binder which cannot be degraded hydrolytically or in any other chemical manner.

A further object is to provide a binder with high thermal stability.

Another object is to provide a binder which will make possible the precondition of exposure with current exposure equipment without starting a degradation of the polymer initiated by this radiation.

SUMMARY OF THE INVENTION

These and other objects are achieved by providing a silylated polymeric binder which bears a plurality of at least one of aliphatic and aromatic hydroxyl groups, at least a portion of which are derivatized by units of the formulae I and II:

and

which are side chains of the polymeric binder, wherein

A denotes a silanyl group containing at least 2 silicon atoms in total linked to each other, but not more than 3 silicon atoms linked to each other in an unbranched chain of silicon atoms;

B denotes a bridging group;

C denotes a functional group which has formed a covalent bond with an aromatic, aliphatic, or cycloaliphatic hydroxyl group of the binder, the group D, or the group E;

D denotes a grafted monohydric or polyhydric aliphatic alcohol;

E denotes a grafted monohydric or polyhydric aromatic alcohol;

n denotes 0 or 1;

m denotes 1 or 2; and o, p, u and v denote 0 or 1.

The modified binders according to the invention are resistant to radiation of a wavelength greater than 300 nm.

The binders contain the silanyl groups on which the silylating reagents of the general formula I are based in the side chain. The term "side chain" means that the silanyl groups are not a constituent of the main polymer chain of the binder. This would not be possible in view of the method of introducing these groups into the binder, since the binder is a polymer even before the silanyl groups are introduced.

As part of the invention, a process for preparing the binder is also included. This comprises reacting the binder with a silylation reagent forming the basis of the functional unit $[(A-B_n)_mC]$ in an aprotic solvent.

Further provided is a photosensitive mixture which comprises the binder and also a photosensitive system. The system includes a compound which is positive- or negative-working.

There is also a photosensitive recording material which comprises a substrate, optionally a planarization layer deposited thereon, and a photosensitive layer applied thereto. The photosensitive layer contains the photosensitive mixture described above.

DETAILED DESCRIPTION OF THE PREFERRED EMBODIMENTS

The invention provides a silylated polymeric binder which bears a plurality of at least one of aliphatic and aromatic hydroxyl groups, at least a portion of which are derivatized by units of the formulae I and II:

$$[(A-B_n)_mC]-[(D_oE_p)BC]_u- \quad (I)$$

and $$[(D_oE_p)BC]_v- \quad (II)$$

which are side chains of the polymeric binder, wherein
A denotes a silanyl group containing at least 2 silicon atoms in total linked to each other, but not more than 3 silicon atoms linked to each other in an unbranched chain of silicon atoms;
B denotes a bridging group;
C denotes a functional group which has formed a covalent bond with an aromatic, aliphatic, or cycloaliphatic hydroxyl group of the binder, the group D, or the group E;
D denotes a grafted monohydric, or polyhydric aliphatic alcohol;
E denotes a grafted monohydric or polyhydric aromatic alcohol.
n denotes 0 or 1;
m denotes 1 or 2; and
o, p, u and v denote 0 or 1.

The functional units $[(A-B_n)_mC]$ comprise the actual silanyl groups which may be bound either directly (u=0) or, if u=1, indirectly via the functional units $[(D_oE_p)BC]_u$, which are described as grafting groups, to the aliphatic or aromatic hydroxyl groups of the polymeric binder.

Silanyl groups having the formula III are suitable as the group A:

$$\begin{array}{c} a_1 \\ | \\ -Si-a_2, \\ | \\ a_3 \end{array} \quad (III)$$

wherein
$a_1$, $a_2$, $a_3$ each independently denote R, $-SiR_3$ and $-Si_2R_5$, with the proviso that at least one of $a_1$, $a_2$, or $a_3$ is $-SiR_3$ and not more than one of $a_1$, $a_2$, or $a_3$ is $-Si_2R_5$; and each R independently denotes ($C_1-C_3$) alkyl, in particular methyl, or aryl, in particular phenyl.

In particular, those silanyl groups are preferred which contain two, three or four silicon atoms and/or contain ($C_1-C_3$)alkyl, in particular methyl, as radical R.

Particularly preferred are the following silanyl groups: $-SiR(SiR_3)_2$, $-Si(SiR_3)_3$ and $-(SiR_2)_2-SiR_3$.

Bridging groups having the formula IV are suitable as the group B:

$$-(b_1)_r-(X)-(b_2)_s- \quad (IV),$$

wherein
$b_1$ denotes ($C_1-C_4$)alkylene, in particular $C_2$-alkylene, or a group containing at least one C—C double bond and resulting from 1,4-cycloaddition (Diels-Alder) reaction of an alkadienylene, in particular a cycloalkadienylene containing a total of at least 4 carbon atoms, in particular cyclopentadienyl, with a dienophile;
X denotes a single bond, $-O-$, $-S-$, $-SO_2-$, $-NH-$, $-NR^1-$,

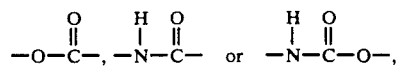

wherein $R^1$ is a ($C_1-C_3$)alkyl,
$b_2$ denotes arylene, in particular naphthylene and phenylene, optionally substituted by ($C_1-C_3$)alkyl, ($C_1-C_3$)alkoxy, in particular by methyl and in the ortho position to the bond which carries the functional group, or cycloalkylene, in particular cyclohexylene; and also
r, s each denote 0 or 1, with the proviso that for the bridging group B that the sum of the values of r and s is at least 1.

Provided $b_2$ is configured in accordance with the above specifications and X represents a single bond, $b_1$ is an alkylene group containing two or more carbon atoms, in particular a $C_2$-alkylene group. Preferably, $b_1$ is bound to group A.

As group C, suitable functional groups include functions resulting from reaction with hydroxyl groups, directly or through an activated intermediate, of, e.g., thiol, hydroxyl, amino, epoxy, optionally bound via an alkyleneoxa, in particular methyleneoxa group, and also aziridino and carboxyl, their derivatives such as esters, chlorides, amides, anhydrides or lactones and lactams, but also isocyanate or carbodiimide.

In particular, those functional groups are preferred which react by addition in a reaction with hydroxyl groups of the binders. Of these, those are preferred in which no amino groups are formed during the addition reaction.

Almost all the functional groups C are monovalent, i.e., the groups A and B or D and E are contained once in a lateral silanyl group of the general formula I (m=1 and n=1). If m=2 and n=1, this group C adjacent to the groups A and B is a bivalent functional group C, for example a group resulting from carbodiimide reaction.

In particular if lactones or lactams are used to form functional groups C, then n=0 (m=1). Of the lactones and lactams, the β-lactones or β-lactams, the δ-lactones or δ-lactams, and the γ-lactones or γ-lactams are preferred. In particular, the corresponding lactones are preferred.

Of the anhydrides, cyclic anhydrides are preferred in particular, since these, in contrast to the open-chain compounds, react according to an addition pattern. Very particularly preferred is the maleic anhydride group. Provided they are a dienophile, the anhydrides are furthermore possibly able to be linked via a suitable bridging group B to the silanyl group A in a 1,4-cycloaddition (Diels-Alder reaction). The anhydride group may, however, also be linked to a diene fragment capable of cycloaddition.

Of the preferred functional groups leading to linkages C, mention must furthermore be made of the epoxy group bound to the silanyl group via an alkyleneoxa group, which epoxy group is linked both via $b_1$, provided s=0 and X is either a less preferred single bond or an

group, and also via $b_2$, provided $s=1$, X is preferably a single bond, and $b_2$ is phenylene.

The isocyanate group is also preferred. It is particularly preferably linked to $b_1$, provided $s=0$, and also to $b_2$, provided $X=$

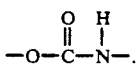

The carbodiimides which have also been mentioned as functional precursors to groups C are allowable for $m=2$ and $n=1$ and only as the group adjacent to the function unit $(A-B_n)_m$. These are obtained by reaction of two isocyanate groups with each other to split off $CO_2$. Consequently, all the remarks which are made for the isocyanate groups are also valid for the carbodiimide groups. The latter are preferably linked to the silanyl group via bridging unit $b_1$, provided $s=0$ and X represents a single bond.

In principle, however, silylation reagents which contain isocyanate groups are preferable to those which contain carbodiimide groups since the former yield products which are more resistant to thermal load and chemical attack.

The preparation of compounds which contain isocyanate groups is described by S. Patai, The Chemistry of Cyanates and their Thio Derivatives, Part 2, page 619 ff. The functional groups are also described which are in principle capable of reacting with this group, in particular entering into an addition reaction.

Furthermore, a large number of functional groups are known to the person skilled in the art which make possible a covalent linkage between silylation reagent and binder. Such groups are described by H. A. Staab in Angew. Chem. 74, 407 (1962).

In addition, those functional groups are also suitable which are used, for example, in peptide chemistry for bond formation and are described, inter alia, by K. Takeda, K. Tsuboyama, K. Yamaguchi and H. Ogura in J. Org. Chem. 50. 273 (1985) or by T. Mukaiyama, M. Usui, E. Shimada and K. Saigo in Chem. Lett. 741 (1975).

In relation to the groups B and C inside the grafting group and the functional unit $(D_oE_p)BC$, the following preferred embodiments may be undertaken:

In this case, the group B preferably has, according to formula IV, (for r and s each equal to 1):
as $b_1$ $C_2$-alkylene,
as $b_2$ phenylene, in particular in the ortho position to the bond which carries the functional group and is substituted by methyl, and for
X a single bond, —O—,

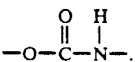

Particularly suitable also are those groups B inside the specified function unit in which
r and s are each equal to 0, and
X represents a single bond.
Equally preferred is the case where
r is 0 and
s is 1, where
X is —O— or

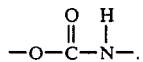

Monohydric and polyhydric aliphatic alcohols are specified as groups D. In particular, those with 2-6 hydroxyl groups are used, including 1,2-glycol, propane-1,2,3-triols, erythritols, pentitols and hexitols. Monohydric alcohols can be used which are bound to the functional group C of this functional unit directly, via a C—C single bond, or via the bridging group B, and in particular, hydroxymethylene groups are mentioned.

The polyhydric alcohols mentioned below can be etherified with further aliphatic alcohols. These alcohols are preferably the same as the alcohols to which they are etherified. Preferred are the products in which all but one hydroxyl is etherified and, among these, those preferred are ethers of propane 1,2,3-triol with itself. The unetherified hydroxyl group, in this case, of the alcohol originally used for etherification preferably carries either the group E ($p=1$) or, for $p=O$, the bridge group B, provided the sum of r and s is not equal to zero. Otherwise (r and s equal to zero and X a single bond), the aliphatic grafting group would be a directly bridging group between the functional group C of the functional unit $(A-B_n)_mC$ and the functional group C of the grafting group and functional unit $(D_oE_p)BC$. In this case, when the compound is a compound according to formula I, a hydroxyl group of group D is in turn required for this purpose to bond the functional group C of the functional unit $(A-B_n)_mC$. In the case where the compound is a compound according to formula II, the polyhydric aliphatic alcohol, provided it is identical with that in formula I, has one additional hydroxyl group since this hydroxyl group no longer has to be derivatized to bind function unit $(A-B_n)_mC$.

For the special case that, in the bridging group B of the functional unit and grafting group $(D_oE_p)BC$, the sum of r and $s=0$ and X represents a single bond, the aliphatic alcohol D may represent a monohydric alcohol if, in particular, an epoxy group is used as a precursor to group C in this function unit with $p=O$. In this case, for example, a hydroxymethylene group bound via a single bond is involved. This special embodiment is of interest if the polymer per se contains predominantly only aromatic hydroxyl groups which have, under certain circumstances, to be converted into more reactive, aliphatic hydroxyl groups. This statement applies, in particular, for lactones as functional groups C.

Monohydric or polyhydric aromatic alcohols (phenols) are specified as groups E. The dihydric to pentahydric aromatic alcohols of benzene or naphthalene are preferred. In particular, however, they are the trihydric to pentahydric alcohols and, of these, the trihydric alcohols of benzene such as phloroglucinol, pyrogallol and hydroxyhydroquinone, pyrogallol being particularly suitable. Monohydric alcohols can be used which are bound via a C—C single bond directly or via a bridging group B to the functional group C of this functional unit, and in particular, hydroxyphenylene groups are specified. Provided $O=1$, one of the specified hydroxyl groups contained in the groups E is required to form an ether function to the adjacent group D, otherwise said hydroxyl group is a link to the functional unit [(A—$B_n$)$_m$C] in the case of the general formula I or is present as a free hydroxyl group in the case of the general formula II. A further hydroxyl group must, however, be reserved for bond formation to the bridging group B.

Specifically for groups E, the bridging group B of this functional unit is configured in particular so that
r is 0 and
$b_2$ (s=1) is phenylene or a phenylene radical substituted b methyl in the ortho position to the bond which carries the functional group.

For the specific case where the sum of r and s is equal to O, and X represents a single bond in this bridging group B, the aromatic alcohol E (o=O) is preferably monohydric if, in particular, epoxy groups are used as precursors to group C, i.e., a hydroxyphenylene group bound, for example, via a single bond. This specific case is encountered if the polymer is per se very hydrophilic. This applies, in particular, to natural substances such as the tannins. Under certain circumstances, the solubility of the binder in alkali-containing developer solvents can be regulated by introducing hydrophobic aromatic groups without appreciably increasing the number of hydroxyl groups at the same time.

Particularly preferred, in general, are also those combinations in which o+p=1. This applies to the compounds of the general formulae I and II to an equal extent.

The sequence of the groups D and E in the molecule is not important for the case where o+p=2.

Since the bridging group B as part of the grafting units in the general formulae I and II has to be bound via the hydroxyl groups of the groups D and/or E, the bridging groups B should be restricted in this case to groups which are capable of reacting with hydroxyl groups. In particular, in this case B is a group of the general formula IV in which
r denotes 0,
X denotes a single bond,

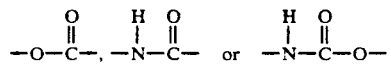

and
$b_2$ denotes phenylene, optionally substituted by ($C_1$-$C_3$)- alkyl, in particular methyl, in the ortho position to the bond which carries the functional group C.

The introduction of the groups D and/or E both into the grafting units of the general formula I (u=1) and II (v=1) serves to modify or to maintain the solubility in alkali of the silylated binder. If the function units [(A—$B_n$)$_m$C] are introduced into the binder containing both aromatic and aliphatic hydroxyl groups, then, depending on the extend of the silylation reaction, a more or less large number of hydroxyl groups which are necessary for the solubility in alkali, is lost. This applies also to the hydroxyl groups of the grafting groups, provided these have already been introduced previously into the binder.

Undoubtedly, the introduction of the silanyl groups into the side chains of the binder may impair the solubility in alkali in the limiting region, i.e., with very high silicon content of the binder.

Nevertheless, in order to ensure the solubility in alkali, the grafting groups can be introduced via the free hydroxyl groups both before the silylation reaction and also after said reaction. Provided v=1, i.e., groups of the general formula II are in general also present as binder side chain, the silylation reaction is preferably carried out before the actual grafting reaction, with preferably u=O. The case frequently occurs in particular also if o=O, i.e., only aromatically bound hydroxyl groups have been introduced by the grafting reaction and the hydroxyl groups originally contained in the polymer are preferably of an aliphatic nature. This is also valid if the grafting reaction has been carried out before the silylation reaction.

On the other hand, particularly if preferably aromatic hydroxyl groups are available for the silylation reaction in the binder itself, introduction of grafting groups which contain aliphatic hydroxyl groups (p=O) can increase the reactivity of the polymer for silylation reagents so that preferentially no "free" grafting groups according to formula II will exist if the grafting group has also been silylated (i.e., v=O and u=1). If, in contrast to this, aromatic hydroxyl groups are present in the grafting groups, free groups according to formula II may increasingly be present (v=1), even also in the case where silylation has been carried out only after the introduction of the grafting group. If the case occurs that, although the binder has a high plasma resistance as a consequence of its high silicon content, its solubility in alkali, on the other hand, is jeopardized, then grafting may optionally be carried out again even after grafting has been carried out earlier and the silylation has then proceeded to completion (in relation to the hydroxyl groups of the grafting reagent).

The grafting groups may be different not only in this specific case for formula I and II, but may also be differently configured inside the formulae I and II.

Depending on the reactivity of the available hydroxyl groups of the polymer, binders having optimum resistance to plasma etching, depending on the requirements imposed and adequate solubility in alkali, may therefore be produced by choosing suitable silylation reactions and the sequence of their reaction with the polymers.

The silicon content of the binders according to the invention is in the range 7 to 30% by weight, based on the binder. In particular, contents of 8 to 20% by weight, particularly from 9 to 14% by weight, are preferred.

In order to be able to react with the functional groups C, the binders must per se contain either aromatic and/or aliphatic hydroxyl groups. Of the binders containing aromatic hydroxyl groups, in particular phenolic groups should be mentioned in which the phenol units on which they are based are condensed into the polymer chain (for example, novolaks, pyrogallol resins), or in which, as in the case of polyvinylphenol, the phenol units are laterally pendant from the polymer chain, as is the case in the following cases, in which the phenol units are bound either in ester fashion to a polymeric acid (for example polymethacrylic acid) or, for example, are present as 4-hydroxybenzaldehyde bound acetal-fashion in a polyvinyl acetal. Aliphatic hydroxyl groups are present, for example, in polyvinyl alcohols and products of this polymer class esterified with polyhydric alcohols of an aliphatic nature, including the copolymers.

Suitable polymers containing hydroxyl groups are, for example, binders of the novolak type. Mention is made, in particular, of phenol-formaldehyde resins, cresol-formaldehyde resins, cocondensates thereof and mixtures thereof, and also phenol and cresol condensates with carbonyl compounds, in particular with formaldehyde. These include the special novolak resins which are composed of mixtures of m-/p-cresol (DE-A-3,626,582), or m-/p-cresols and m-/p- and o-cresols (EP-A-0,070,624). Also included are novolak resins which have been produced from mixtures of m-/p-cresols and xylenols by condensation with aldehydes (JP-A-164740/1985). Novolak resins of higher molecular weight are also included, in particular those which are prepared from mixtures of monoalkylated alkylphenols and whose alkyl groups are in the m- or p-position to the phenolic hydroxyl groups. However, pure cresol-formaldehyde resins such as those described in JP-A-57339/1985, are also possible. Also the combination of pure m-cresol resins with alkylphenols (EP-A-0,239,423). In particular, those novolak resins are used which are described in U.S. Patent Applications Serial Nos. [Atty. Docket No. 16878/108, Doessel et al., corresponding to German Patent App. No. P 38 106 32.9] and [Atty. Docket No. 16878/215, Schmitt et al., corresponding to German Patent App. No. P 38 106 31.0], both filed at the German Patent Office on Mar. 29, 1988.

The novolak resins to be used according to the invention have a melting range which starts at 105° C. In the case of novolak resins whose melting range extends from 105° to 120° C., the glass transition temperature (Tg) is in general below 100° C. Particularly preferred for the present invention, however, are novolak resins whose glass transition temperature is at least 110° C., in particular at least 115° C.

The binders mentioned have a (reduced mean molecular weight) value of 10 to 40, in particular of 15 to 30.

The determination of the RMMW value is described in the aforementioned U.S. Patent Apps., Serial Nos. [Atty. Docket Nos. 16878/108 and 16878/215].

Preferred are the binders which are produced from a mixture which contains at least 50 mol-% of a phenol substituted in the meta position, ($C_1$-$C_3$)alkyl, in particular methyl, being suitable as substituents. Among these, in turn, mention should be made of those binders whose preparation mixtures contain (a) at least 60 mol-% of a phenol substituted in the meta position and up to 40 mol-% of a trireactive or bireactive phenol of the general formula I

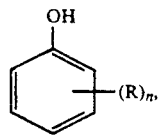

where

R denotes ($C_1$-$C_4$)alkyl, in particular methyl, ethyl and/or tert-butyl and n denotes an integer from 1 to 3, in particular 2 or 3, or (b) at least 70 mol-% of the phenol substituted in the meta position and up to 30 mol-% of a monoreactive phenol of the general formula II

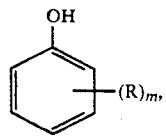

where

R denotes ($C_1$-$C_4$)alkyl, in particular methyl, ethyl and/or tert-butyl and m denotes an integer from 2 to 4, in particular 3.

Particularly preferred are binders whose preparation mixtures contain up to 30 mol-%, particularly preferably up to 20 mol-%, of a trireactive or bireactive phenol of the general formula I, or those which contain up to 15 mol-%, particularly preferably up to 10 mol-%, of a monoreactive phenol of the general formula II. The trireactive phenols include those which are substituted in positions 3, 5 or 3 and 5 by R. The bireactive phenols are substituted in the position 2 or position 4, in the positions 2 and 3, 3 and 4, 2 and 5 or in the positions 2, 3 and 5 and also 3, 4 and 5. Monoreactive phenols are distinguished by the fact that they have substituents in the positions 2 and 4 or 2 and 6, 2, 3 and 4, 2, 3 and 6 and also 2, 4 and 5 or 2, 3, 4 and 5 and also 2, 3, 5 and 6.

The novolak binders to be used in the manner according to the invention may be modified to a certain extent with chloroacetic acid, isocyanates, epoxides or carboxylic acid anhydrides (DE-A-2,718,254).

Polymers of the polyvinylphenol type containing hydroxyl groups are also regarded as suitable for the binder according to the invention. Such polymers of o-, m- and p-vinylphenols are described in DE-A-2,322,230 and DE-A-3,309,222. Derivatives are mentioned in DE-A-3,406,927.

In addition, copolymers of vinylphenol with components containing aliphatic hydroxyl groups should be mentioned, for example hydroxyethyl (meth)acrylate.

Binders which contain hydroxyl groups and which are copolymers of maleic anhydride and styrene, of vinyl acetate and crotonic acid, or of alkyl methacrylate, butadiene and methacrylic acid are also suitable (DE-A-3,107,526).

In addition, hydroquinone monomethacrylate and dihydroxynaphthalene monomethacrylate may be employed (JP-A-36129/1976).

Derivatives of (meth)acrylic acid which contain pyrocatechol or pyrogallol units in the side chain are also described in DE-A-3,528,929 and DE-A-3,528,930, and are therefore particularly suitable for this use. Binders which are (meth)acrylic acid/alkyl (meth)acrylate copolymers are mentioned in DE-A-3,730,881.

Binders which are suitable for photosensitive mixtures and which are based on polymers containing hydroxyl groups and have been reacted with acid anhydrides are known from EP-A-0,152,819. Just like these, the modified polyvinyl acetals from DE-A-3,644,162 and DE-A-3,644,163 are also suitable for preparing the binders according to the invention.

Binders which are intended for photosensitive mixtures, are soluble or at least swellable in aqueous alkali and contain lateral groups of the formula —CH$_2$OR, where R may signify hydrogen, or lower alkyl, acyl or hydroxyalkyl groups, are mentioned in DE-A-3,442,756 and also DE-A-3,329,443. Provided they contain a sufficient number of free hydroxyl groups, these binders are used as starting materials for the binders according to the invention.

Binders of the pyrogallol type which are soluble or at least swellable in alkali are also used to prepare the binders according to the invention. These contain trihydroxyphenol units as constituents of the polymer chain. Three aromatic hydroxyl groups are therefore available for reaction with silylation reagents to obtain the binders according to the invention (U.S. Pat. No. 3,635,709).

But polymers which contain 3,4,5-trihydroxyphenolcarboxylic acid (gallic acid) units are also suitable as starting polymers for the preparation of the binders according to the invention. In particular, the natural tannic acids (tannins) should be mentioned. In these, the hydroxyl functions of glucose units are esterified to a varying extent with the gallic acids. For example, β-penta-O-galloyl-D-glucose is suitable. It is, however, also possible that each hydroxyl function of the glucose units is not only esterified in each case with a gallic acid molecule, so-called depsides of two molecules of gallic acid (=m-galloylgallic acid) may in each case also react as a unit with a hydroxyl function of glucose. β-Penta-O-digalloyl-D-glucoses are then produced. The natural tannins containing gallic acids are described by E. Haslam in Fortschritte der Chem. Org. Naturst. 41, page 1 ff (1982).

The binders claimed according to the invention are resistant to UV radiation, in particular in the region of a wavelength greater than 300 nm.

Preferred representatives of the silylation reagents forming the basis of the function unit $(A-B_n)_mC$ are described in U.S. Patent Application Serial No. [Atty. Docket No. 16878/179, Wilharm et al.], simultaneously filed with the present application and corresponding to German Patent Application P 38 11 241.8. Their preparation is also described there.

Mentioned in particular are: 2-(pentaalkyl-or-aryl-disilanyl)-($C_1$–$C_4$)alkyl isocyanates, 2-[tris(trialkyl- or -arylsilyl)silanyl]-($C_1$–$C_4$)alkyl isocyanates, 2-[bis(trialkyl- or -arylsilyl)alkylsilanyl]-($C_1$–$C_4$)alkyl isocyanates and also 2-(heptaalkyl- or -aryltrisilanyl)-($C_1$–$C_4$)alkyl isocyanates. Among the representatives of these monomers, those are particularly preferred whose silanyl radical carries alkyl groups, in particular methyl. As a link, the ethylene group is particularly preferably employed in these compounds.

Preferred representatives of those compounds which contain epoxy groups as functional groups are: 4-(ω-pentaalkyl- or -aryldisilanyl($C_1$–$C_4$)alkyl)phenyl 2',3'-epoxypropyl ethers, 4-[ω-tris(trialkyl- or -aryl-silyl)-silanyl($C_1$–$C_4$)alkyl]-phenyl 2',3'-epoxypropyl ethers, 4-[ω-bis(trialkylsilyl)alkylsilanyl($C_1$–$C_4$)-alkyl]-phenyl 2',3'-epoxypropyl ethers, and also 4-[ω-heptaalkyl-trisilanyl($C_1$–$C_4$)alkyl]-phenyl 2',3'-epoxypropyl ethers. Also suitable are the corresponding compounds whose silanyl radical is situated in position 2 instead of position 4 on the benzene ring with respect to the 2',3'-epoxypropyloxy group. The ($C_1$–$C_4$)-alkylene bridge through which the silanyl radical is linked, both in position 2 and also preferably in position 4, is particularly preferably at least a $C_2$-alkylene radical, $C_2$-alkylene also being the preferred radical of this series. The silanyl radical is then joined at position 2 of the $C_2$-alkylene radical. In this compound class, those compounds are also particularly preferred in which alkyl groups are present in the respective silanyl radicals. The preferred alkyl group is methyl. The aromatic unit in the bridging group of the compounds described here may also be substituted by alkyl and alkoxy. This embodiment is, however, not preferred.

Preferred representatives of Diels-Alder products are: (2,3)-endo-7-anti-(pentaalkyl- or- aryldisilanyl)-bicyclo[2.2.1]hept-5-ene-2,3-dicarboxylic anhydride, (2,3)-endo-7-anti-[tris(trialkyl- or -arylsilyl)silanyl]-bicyclo-[2.2.1]hept-5-ene-2,3-dicarboxylic anhydride, (2,3)-endo-7-anti-[bis(trialkyl- or -arylsilyl)alkylsilanyl]-bicyclo[2.2.1]hept-5-ene-2,3-dicarboxylic anhydride, (2,3)-endo-7-anti-[heptaalkyl- or -aryltrisilanyl]-bicyclo[2.2.1]hept-5-ene-2,3-dicarboxylic anhydride. Particularly preferred are compounds in which alkyl groups are present in the respective silanyl radical. The preferred alkyl group is methyl.

Of the lactams or lactones, the following compounds are preferred: 3-(pentaalkyl- or- aryldisilanyl)lactones and lactams, tris(trialkyl- or -arylsilyl)silanyl lactones and lactams, bis(trialkyl- or arylsilyl)-alkylsilanyl lactones and lactams, and also heptaalkyltrisilanyl lactones and lactams. Particularly preferred are those compounds in which alkyl groups are present in the respective silanyl radicals. The preferred alkyl group is methyl.

Lactones are particularly preferred, in particular β-propiolactones, β- and γ-butyrolactones, β-, γ- and δ-valerolactones, γ- and δ-caprolactones.

Of the functional units derived from a carbodiimide as a functional group, those compounds should be mentioned which are analogous to those derived from isocyanate groups. In comparison with the latter, those compounds containing carbodiimide are less preferred since they are less hydrolytically stable.

Furthermore, functional units are preferred whose bridging group is derived from carbamate ester units as X. The actual functional groups may be bound directly in ester fashion to these units, but the units may also function as a connecting link in the bridging group, i.e., not be connected directly to the functional groups.

The following should be mentioned as examples: N-[ω-(pentaalkyl- or -aryldisilanyl)($C_1$–$C_4$)-alkyl]carbamic acid 2',3'-epoxypropyl esters, N-{ω-[tris-(trialkyl- or -arylsilyl)silanyl]-($C_1$–$C_4$)-alkyl}carbamic acid 2',3'-epoxypropyl esters, N-{ω-[bis-(trialkyl- or -arylsilyl)alkylsilanyl]-($C_1$–$C_4$)-alkyl carbamic acid 2',3'-epoxypropyl esters, and N-[ω-(heptaalkyl- or -aryldisilanyl)-($C_1$–$C_4$)-alkyl]carbamic acid 2',3'-epoxypropyl esters.

Of these, those are preferred which contain alkyl groups, especially methyl. Of the bridging ($C_1$–$C_4$)-alkylene units, those are preferred which contain $C_2$-alkylene, so that the position "ω" may be more precisely defined as position 2. In addition to these, the following are particularly preferred: N-isocyanatophenyl-carbamic acid ω-silanyl-($C_1$–$C_4$)-alkyl esters, in each case pentaalkyldisilanyl, tris(trialkylsilyl)silanyl, bis(trialkylsilyl)alkylsilanyl and heptaalkyltrisilanyl and also the corresponding arylsilanyl groups being understood as silanyl, as in the previous examples.

As ($C_1$–$C_4$)-alkylene radicals, those are preferred which contain $C_2$-alkylene, so that the position "ω" may be more precisely defined as position 2. Very particularly preferred are compounds of this type which carry the isocyanate groups in position 4 of the phenyl radical, of which those are particularly employed whose phenyl radical is additionally substituted in position 3 by alkyl, in particular by methyl. The alkyl substituents of the silanyl groups are preferably methyl.

The silanyl compounds forming the basis of these silylation reagents must be halogenated, in particular chlorinated, in order to be able to react with the bridging groups described. Mixtures of compounds of this type are produced in industrial quantities as byproducts of the so-called direct synthesis, as it is described, for example, by R. Schliebs and J. Ackermann in Chem. i. u. Zt. 21, 121 (1987). Furthermore, compounds of this type can be systematically synthesized in good yields starting from the simplest silicon compounds. On this, comprehensive details are to be found, for example, in the following publications: M. Kumada and K. Tamao in Adv. Organomet. Chem. 6, 19 (1968) and E. Hengge in Topics in Current Chemistry 51, 1 (1974).

The binders according to the invention containing the silanyl groups described in the side chains all have the properties required according to the object. In particular, the following should be mentioned:
They can be prepared in a simple manner and have an adequate solubility in aqueous alkali,
a very high resistance to plasma etching, for example in the case of reactive ion etching with oxygen,
a surprisingly long storage stability, and also
a high resistance to radiation with which the exposure to an image of photosensitive mixtures can nowadays be undertaken (I- and H-line exposure equipment, wavelength greater than 300 nm) and which is unexpected in light of the prior art.

As particularly preferred examples which form the basis of the functional units $(D_oE_p)BC$, the grafting groups, the following compounds are mentioned: 2,3-epoxy-1-propanol, diisopropylidenetriglycerol glycidyl ether, triglycerol glycidyl ether, 2-ethoxy-4-(2',3'-epoxypropyloxy)-1,3-benzodioxole, and the reaction product of 2-ethoxy-4-hydroxy-1,3-benzodioxol with toluene 2,4-diisocyanate.

2,3-Epoxy-1-propanol proves to be particularly advantageous in relation to commercial availability, reactivity and application-engineering characteristics.

In each case, several silylation reagents and/or grafting reagents may also be reacted at the same time with one or several binder types. The reaction conditions chosen in that case, for example temperature, time, solvent and substance concentration, depend on the relative reactivity of the reagents in relation to their reaction with the binder or the binders and can readily be determined by the person skilled in the art without carrying out inventive work.

The present invention also includes a photosensitive mixture containing the binders according to the invention.

The photosensitive mixtures according to the invention contain, as essential constituents, a component or a system which is photosensitive, and also the binder, which has silanyl groups in the side chain and is soluble in aqueous alkali.

In the photosensitive mixtures, the binders according to the invention may be mixed with other, unsilylated binders. Phenolic resins which have also been used to obtain the binder according to the invention prove, for example, to be advantageous.

The addition of such film formers should not exceed the proportion of 40% by weight in relation to the solids content of the photosensitive mixture in order not to reduce the resistance to reactive ion etching.

The quantity of binder in the photosensitive mixture is in general 50 to 95% by weight, preferably 70 to 90% by weight, based on the nonvolatile constituents of the mixture.

As photosensitive components or as systems, mention is made of those compounds which, in the photosensitive mixture, either become more soluble towards an aqueous alkaline developer solution after exposure to actinic radiation or also those compounds which become insoluble under the said conditions, i.e., initiate a crosslinking reaction. The first case involves positive-working photosensitive mixtures, the second involves negative-working ones. The positive-working mixtures are preferred.

The positive-working photosensitive compounds include compounds from the substance class of the o-quinonediazides which are described in J. Kosar "Light Sensitive Systems", John Wiley and Sons/New York, 1965, pages 343 to 351.

Preferably, the amides and esters of o-naphtho- or o-benzoquinonediazides should be mentioned. Bis-1,2-naphthoquinone-2-diazidesulfonic amides are described, for example, in EP-A-0,231,855. Preferably, mention should be made, however, of the esters with mono- to polyhydroxybenzophenones, mono- to polyhydroxyacylphenones, gallic acids, phloroglucinol, mono- to polyhydroxydiphenylmethanes, bis(hydroxyphenyl)-valeric acid esters.

Particularly preferred are the trihydroxy compounds, in particular trihydroxybenzophenone, and of these in turn the tris esters with o-naphtho or o-benzoquinonediazidesulfonic acids. The diazide-4- and -5-sulfonic acid esters, but also mixed esters, in particular tris esters of the -4- and -5-sulfonic acids are suitable. Compounds of this type are described in DE-C-938,239, 2,131,377, 2,547,905 and 2,828,017.

The quantity of o-quinonediazide compounds is in general 5 to 50% by weight, preferably 10 to 35% by weight, based on the nonvolatile constituents of the photosensitive mixture.

Components which split off or form preferably a strong acid (starter) on irradiation are also suitable as photosensitive compounds in the positive-working photosensitive mixture according to the invention in combination with compounds which can be split by acid. The starters are diazonium, phosphonium, sulfonium and iodonium salts, halogen compounds, o-quinonediazidesulfochlorides and their esters and also organometal/organohalogen combinations.

The diazonium, phosphonium, sulfonium and iodonium compounds are, as a rule, employed in the form of their salts which are soluble in organic solvents, generally as deposition products with complex acids such as tetrafluoroboric acid, hexafluorophosphoric, hexafluoroantimonic and -arsenic acid. These compounds are also mentioned, inter alia, in DE-A-3,601,264.

The halogen compounds include, in particular, triazine derivatives which are known from U.S. Pat. Nos. 3,515,552, 3,536,489 and 3,779,778, and also DE-C-2,718,259, 3,337,024, 3,333,450, 2,306,248, 2,243,621 and 1,298,414. These may, however, also be employed in combination with other photoinitiators such as oxazoles, oxadiazoles or thiazoles, but also in mixtures with each other.

Oxazoles, oxadiazoles, thiazole or 2-pyrones which contain the trichloro- or tribromomethyl groups are, however, also known (DE-A-3,021,599, 3,021,590, 2,851,472, 2,949,396 and also EP-A-0,135,348 and 0,135,863).

This generic term also includes, in particular, aromatic compounds which contain halogen, preferably bromine, situated in the nucleus. Such compounds are known from DE-A-2,610,842 or are described in the German Patent Application P 3,730,784.3.

As a representative of a combination with a thiazole, mention should be made of one with 2-benzoylmethylennaphtho-[1,2-α]thiazole (DE-A-2,851,641 and DE-A-2,934,758). A mixture of a trihalomethyl compound with N-phenylacridone is known from DE-A-2,610,842.

α-Halocarboxylic amides (DE-A-2,718,200) or tribromomethylphenylsulfones (DE-A-3,503,113), which may be sensitized by benzophenone, benzil or Michler's ketone, are also available.

Examples of suitable starters are: 4-(di-n-propylamino)benzenediazonium tetrafluoroborate, 4-p-tolylmercapto-2,5-diethoxybenzenediazonium hexafluorophosphate and -tetrafluoroborate, diphenylamine-4-diazonium sulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 3-nitro-1-tribromoacetylbenzene, 4-dibromoacetylbenzoic acid, 1,4-bisdibromomethylbenzene, tris-dibromomethyl-s-triazine, 2-(6-methoxynaphth-2-yl), 2-(naphth-1-yl)-, 2-(naphth-2-yl)-, 2-(4-ethoxyethylnaphth-1-yl),2-(benzopyran-3-yl)-, 2-(4-methoxyanthrac-1-yl)-, 2-(4-styrylphenyl)-, 2-(phenanthr-9-yl)-4,6-bis-trichloromethyl-s-triazine and the compounds cited in the examples.

The quantity of the starter may be varied, depending on its chemical nature and the composition of the mixture. Favorable results are obtained with about 0.1 to 10% by weight, based on the nonvolatile constituents of the mixture, 0.2 to 5% by weight being preferred. As a rule, however, all the photosensitive and radiation-sensitive compounds described can be reinforced in their effectiveness by photosensitizers. Mention should be made, for example, of anthracene, phenanthrene, pyrene, 1,2-benzanthrene, thiazines, pyrazolines, benzofurans, benzophenones, fluorenones, anthraquinones and also coumarin derivatives. Their content is 0.01 to 5% by weight, based on the weight of the radiation-sensitive mixture.

As acid-cleavable material in the photosensitive mixture according to the invention, the following classes of compounds have, in particular, proved successful:

(a) those containing at least one orthocarboxylic acid ester grouping and/or carboxylic acid amide acetal grouping; it being possible for the compounds also to have a polymeric character and the said groupings to occur as linking elements in the main chain or as lateral substituents, (b) oligomeric or polymeric compounds with repeating acetal and/or ketal groupings in the main chain, (c) compounds containing at least one enol ether grouping or N-acyliminocarbonate grouping, (d) cyclic acetals or ketals of β-ketoesters or -amides, (e) compounds containing silyl enol ether groupings and (f) monoacetals or monoketals whose aldehyde or ketone components respectively have a solubility in the developer of between 0.1 and 100 g/l, (g) ethers based on tertiary alcohols, (h) carboxylic acid esters and carbonates of tertiary, allylic or benzylic alcohols.

Acid-cleavable compounds of the type (a) as components in radiation-sensitive mixtures are described extensively in EP-A-0,022,571 and DE-A-2,610,842; mixtures which contain compounds of the type (b) are presented in DE-C-2,306,248 and DE-C-2,718,254; compounds of the type (c) are described in EP-A-0,006,626 and 0,006,627; compounds of the type (d) are presented in EP-A-0,202,196; compounds of the type (e) are to be found in the German Patent Application P 3,730,783.5, while compounds of the type (f) are dealt with in the German Patent Applications P 3,730,785.1 and P 3,730,787.8. Compounds of the type (g) are described in U.S. Pat. No. 4,603,101; compounds of the type (h) are described in U.S. Pat. No. 4,491,628 and by J. M. Frechet et al., J. Imaging Sci. 30, 59–64 (1986).

Mixtures of the said acid-cleavable materials may also be employed. Preferred, however, is an acid-cleavable material which can be assigned to one of the types mentioned above. Particularly preferred among the materials are those which contain at least one acid-cleavable C—O—C bond, and also, in particular, those which belong to the types (a), (b), (c) and (h). Among type (b), the polymeric acetals, in particular, should be highlighted.

The content of acid-cleavable material in the photosensitive mixture according to the invention should be 5 to 45% by weight, preferably 5 to 30% by weight, in each case based on the total weight of the layer.

Suitable photosensitive compounds in the negative-working photosensitive mixtures according to the invention are, in particular, aromatic azido compounds. Compounds of this type are mentioned by Kosar in "Light Sensitive Systems", John Wiley & Sons, Inc., New York/London/ Sydney, 1965, pages 330 to 336.

Aromatic azido compounds are mentioned in general in DE-A-2,757,056. In particular, 4,4'-diazidostilbene, 4,4'-diazidochalcone, 4,4'-diazidobenzophenone, 2,6-bis(4'-azidobenzylidene)cyclohexanone, 2,6-bis(4,4'-azidobenzal)-4-methylcyclohexane and 1,6-diazidopyrene are suitable.

Photosensitive polymeric esters with terminal aromatically bound azido groups may also be employed in the photosensitive mixture according to the invention. Compounds of this type are described in DE-A-2,251,828, and preferred representatives of the acid components forming the basis of these esters are: 4-azido-α-bromo-δ-chlorocinnamylideneacetic acid, 4-azido-δ-chlorocinnamylideneacetic acid, 4-azido-α-cyano-δ-chlorocinnamylideneacetic acid, 4-azido-α-cyanocinnamylideneacetic acid, 3-azidobenzylidene-α-cyanoacetic acid, 4-azidobenzylidene-α-cyanoacetic acid, 4-azido-2-chlorobenzylidene-α-cyanoacetic acid, 4-azido-3,5-dibromobenzylidene-α-cyanoacetic acid, 3-azido-4-methylbenzylidene-α-cyanoacetic acid, 3-azido-3-methoxybenzylidene-α-cyanoacetic acid.

Azidonitrones (DE-A-1,572,066), azidoazomethines (DE-A-1,572,067), azidostyryl compounds (DE-A-1,572,068, DE-A-1,572,069, DE-A-1,572,070) and azidochalcone compounds (DE-A-1,597,614) may also be used as aryldiazides.

Compounds containing hydroxyl groups are, in particular, epoxy resins, polyvinyl alcohol, cellulose compounds or novolak resins.

The photosensitive compounds for the negative-working photosensitive mixture according to the invention are employed in 0.5 to 40% by weight, particularly preferably in 1 to 10% by weight, based on the nonvolatile components of the layer.

The photosensitive mixture according to the invention has a silicon content of 7 to 30% by weight, in particular 8 to 20% by weight, and particularly preferably 9 to 14% by weight.

Furthermore, dyestuffs, pigments, plasticizers, wetting agents and leveling agents, but also polyglycols, cellulose ethers, for example ethylcellulose, may optionally be added to the positive- and negative-working photosensitive mixtures according to the invention to improve specific requirements, such as flexibility, adhesion or gloss.

Preferably, the photosensitive mixture according to the invention is dissolved in solvents such as ethylene glycol, glycol ethers such as glycol monomethyl ether, glycol dimethyl ether, glycol monoethyl ether or propylene glycol monoalkyl ethers, in particular propylene glycol methyl ether; aliphatic esters such as ethyl acetate, hydroxyethyl acetate, alkoxyethyl acetate, n-butyl acetate, propylene glycol monoalkyl ether acetate, in particular propylene glycol methyl ether acetate or amyl acetate; ethers such as dioxane, ketones such as methyl ethyl ketone, methyl isobutyl ketone, cyclopentanone and cyclohexanone; dimethylformamide, dimethylacetamide, hexamethylphosphoric acid amide, N-methylpyrrolidone, γ-butyrolactone, tetrahydrofuran and in mixtures of the same. Particularly preferred are glycol ethers, aliphatic esters and also ketones.

The solutions produced with the remaining constituents of the photosensitive mixture have, as a rule, a solids content of 5 to 60% by weight, preferably 10 to 50% by weight.

The invention further includes a process for preparing the binders which are soluble in aqueous alkali and contain silanyl groups in the side chain is provided. The process comprises reacting a binder containing aromatic and/or aliphatic hydroxyl groups with a silylation reagent forming the basis of the functional unit $[(A-B_n)_mC]$ in an aprotic solvent, in particular a aliphatic or cycloaliphatic ether or ester at a temperature up to 120° C., in particular 40° to 90° C. Optionally, the binder may be reacted beforehand in a solvent corresponding to the above-mentioned type, in particular in the same, with a grafting reagent which forms the basis of the functional unit $(D_oE_p)BC$. This reaction is preferably carried out at temperatures above 0° C., in particular at 60° to 90° C.

Provided the binder is to be both silylated and grafted, although both reactions are carried out in sequence, they are preferably carried out continuously, i.e., without isolating the product formed first in each case, in the reaction vessel.

Since the bond formation in each case involves a reaction with a hydroxyl group, both reactions may be carried out in the presence of suitable catalysts. Catalysts of this kind are mentioned by L. Thiele in Acta Polymerica 30, 323 (1979) and by P. Schnurrenberger, M. F. Zueger and D. Seebach in Helv. Chim. Acta 65, 1197 (1982).

The addition of a catalyst of the type of the tertiary amines, in particular diazabicyclo[2.2.2]octane is particularly advantageous if isocyanate groups or epoxy groups are to be employed as functional groups C for bond formation with the hydroxyl function of the binder or the grafting groups.

The addition of a catalyst of the type of orthotitanic acid esters, in particular tetraethyl titanate, is particularly advantageous if the linking of a covalent bond between the silylation reagent and the hydroxyl function of the binder is to be brought about by a transesterification reaction.

The isolation is carried out by precipitation of the respective product in a water-containing organic solvent (mixture) to which an acid, in particular inorganic acids, is optionally added. The addition of acids is necessary in order to liberate the hydroxyl groups of the grafting units which are optionally protected by groups unstable toward acid.

The invention additionally provides a photosensitive recording material, which is composed essentially of a substrate, optionally of a planarization layer deposited thereon and the photosensitive mixture applied thereto.

Suitable substrates are all the materials from which capacitors, semiconductors, multilayer printed circuits or integrated circuits are composed or can be prepared. Mention should be made, in particular, of surfaces of pure silicon and thermally oxidized silicon material and/or silicon material coated with aluminum which may optionally also be doped, including all the other standard substrates in semiconductor technology such as, for example, silicon nitride, gallium arsenide, indium phosphide. Furthermore, the substrates known from liquid-crystal display production such as glass, indium-/tin oxide, are suitable; also metal plates and foils, for example of aluminum, copper, zinc; bimetallic and trimetallic foils, but also electrically non-conducting foils which are vapor-coated with metals, $SiO_2$ materials and paper optionally coated with aluminum. These substrates may be subjected to a temperature pretreatment, superficially roughened, initially etched or treated with chemicals to achieve required properties such as, for example, an increase in the hydrophilic nature.

In a particular embodiment, the photosensitive mixture may contain an adhesion promoter to improve the adhesion in the resist or between the resist and the substrate. In the case of silicon substrates or silicon dioxide substrates, adhesion promoters of the aminosilane type such as, for example, 3-aminopropyltriethoxysilane or hexamethyldisilazane are suitable for this purpose. Examples of bases which can be used to prepare photomechanical copying layers such as type forms for relief printing, lithography, screen printing, intaglio printing and also of relief copies, are aluminum plates, optionally anodically oxidized, granulated and/or silicatized aluminum plates, zinc plates, steel plates which have optionally been processed with chromium, and also plastic films or paper.

In the so-called two-layer process, a planarization layer is applied to the generally complicated substrate topography of varying height. In this case, the substrate has already been processed previously photolithographically, i.e., the surface of the substrate has already been structured with the aid of an applied photoresist solution, subsequent exposure and development. Before such a processed substrate can again be processed photolithographically, with recourse to a further photoresist layer, the roughness of the substrate is as a rule smoothed out by a planarization layer before the resist layer is applied. These layers are composed as a rule of materials which can readily be removed by reactive ion etching. As examples, mention may be made of: optionally thermally treated novolak resins, polyimides, optionally thermally treated novolak-based positive resists, polystyrene, polymethyl (meth)acrylate, polyvinyl acetate and mixtures prepared therefrom. Such layers have as a rule a thickness of 0.5 to 5 μm.

The copying material according to the invention is exposed to an image. Sources of actinic radiation are: metal halide lamps, carbon arc lamps, xenon lamps and mercury vapor lamps. Exposure can also be carried out with high-energy radiation such as laser radiation, electron radiation or X-ray radiation. As lasers, mention is made, in particular, of helium/neon lasers, argon lasers, krypton lasers and also helium/cadmium lasers.

The layer thickness of the photosensitive layer varies as a function of its field of application. It is between 0.1 and 100 μm, and in applications for the manufacture of microelectronic circuits it is, in particular, between 0.3 and 10 μm.

The invention also includes a process for preparing the photosensitive copying material. After the deposition of the material for the planarization layer, depending on whether the substrate is flat or rough, the photosensitive mixture is applied to the substrate. This can be carried out by spraying on, flowcoating, rolling, spincoating or immersion coating. Then the solvent is removed by evaporation so that the radiation-sensitive layer remains behind on the surface of the substrate. The removal of the solvent may optionally be promoted by heating the layer to temperatures of up to 140° C. The mixture may, however, also first be applied in the above-mentioned manner to the intermediate base, from which it is transferred under pressure and elevated temperature to the final base material.

The layer is subsequently exposed to an image. Usually actinic radiation is used, but also UV, X-ray or electron radiation is preferred. For exposure, UV lamps are used which emit radiation of a wavelength of 200 to 500 nm having an intensity of 0.5 to 60 mW/cm$^2$. In the light-sensitive layer, an image pattern is subsequently revealed by development by treating the layer with a developing solution which dissolves or removes the radiated regions of the material.

Solutions of alkaline reagents such as, for example, silicates, metasilicates, hydroxides, hydrogenphosphates or dihydrogenphosphates, carbonates or hydrogencarbonates, in particular of alkali or also of organic bases such as choline or ammonium ions, tetramethylammonium hydroxide, but also ammonia and the like are used as developers. The content of these substances in the developer solution is in general 0.1 to 15% by weight, preferably 0.5 to 5% by weight, based on the weight of the developer solution.

Particularly advantageous in relation to uniformity of the development is the action of additives of surface active compounds of the type of alkoxylated phenols.

The developed resist structures are optionally post-cured. This is carried out in general by heating the resist structure on a hot plate up to a temperature below the flow temperature and subsequently exposing the entire surface to UV light from a xenon/mercury vapor lamp (range from 200 to 250 nm). This postcuring crosslinks the resist structures so that the structures have a flow resistance in general up to temperatures over 200° C. The postcuring may also be carried out without increasing the temperature by irradiation with UV light. This is the case, in particular, if high-energy light is used, for example electron radiation.

The regions, laid bare by development, of the substrate or of the planarization layer, provided one has been applied to the substrate before the deposition of the photoresist, are subsequently etched. The particular resistance of the resist structures left behind on development to reactive ion etching is then determined on the basis of layer thickness measurements with a layer thickness measuring apparatus of the type Sloan Dektak II.

The following process parameters are adhered to for transferring the structure of the photolithographic region laid bare to the substrate by plasma etching. In the case of reactive oxygen etching, in particular an oxygen pressure of 1 to 100 mTorr, and an irradiated high-frequency power of 50 to 400 W.

The following examples are intended to illustrate specific embodiments of the invention in more detail, but are not limitative thereof. Preparation of the silylation reagents is described in U.S. Patent Application Serial No. [Atty. Docket No. 16878/179, Wilharm et al.], simultaneously filed with the present application and corresponding to German Patent Application P 38 11 241.8.

The binders prepared for comparison and containing only monosilane groups do not have the advantages which are achievable with the monomers prepared according to the invention. In particular, compared with those which are reacted with the silylation reagents according to the invention, the binders which contain monosilane groups do not show adequate resistance to plasma etching, with the proviso that in both cases the molar ratios of the reaction starting products are identical and in the case of the binders according to the invention, in particular, an adequate resistance to plasma etching is achieved.

The preparation is described below of three different compounds which are suitable for grafting the binder:

PREPARATION EXAMPLE 1

Preparation of triglycerol glycidyl ether 20 g of diisopropylidenetriglycerol glycidyl ether are dissolved in 20 ml of tetrahydrofuran in a 100 ml flask and 2 ml of water and drop of concentrated hYdrochloric acid are then added. Stirring is carried out for 3 h at 30° C. and 0.5 g of potassium carbonate is then added and stirring is carried out for 1 h. The solution is filtered and freed of solvent using a rotary evaporator. The residue is dried to constant weight in an oil-pump vacuum. A viscous colorless oil is left behind which is sufficiently pure for the subsequent reactions with the binders.

The starting product diisopropylidenetriglycerol glycidyl ether is a development product of the SOLVAY company.

PREPARATION EXAMPLE 2

Preparation of 2-ethoxy-4-(2',3'-epoxypropyloxy)-1,3-benzodioxole

A mixture of 10.9 g of 2-ethoxy-4-hydroxy-1,3-benzodioxole, 5.5 g of epichlorohydrin, 0.5 g of potassium iodide and 10 g of potassium carbonate are heated under reflux while stirring for 8 h in a 100 ml flask. The precipitated salt and the excess potassium carbonate are then filtered off and the solution is evaporated down using a rotary evaporator. The oily residue is distilled in a bulb tube apparatus. The product is obtained in 35% yield as a colorless, noncrystallizing oil.

The starting product 2-ethoxy-4-hydroxy-1,3-benzodioxole can be prepared according to an instruction by F. Dietl, G. Gierer and A. Merz in Synthesis, page 626 (1985).

PREPARATION EXAMPLE 3

Preparation of the reaction product of 2-ethoxy-4-hydroxy-1,3-benzodioxole and toluene 2,4-diisocyanate 17.4 g of toluene 2,4-diisocyanate in 50 ml of tetrahydrofuran are placed in a 100 ml flask under an atmosphere of nitrogen. 18.2 g of 2-ethoxy-4-hydroxy-1,3-benzodioxole and 0.02 g of diazabicyclo[2.2.2]octane are added thereto. The reaction solution is subsequently stirred for a further 8 h at 50° C. and the solvent is then distilled off using a rotary evaporator. A highly viscous residue is left behind which does not, however, crystallize and is sufficiently pure for the subsequent reactions with the binders.

The silylation reagents necessary for the preparation of the binders according to the invention are described in U.S. Patent Application Serial No. [Atty. Docket No. 16878/179, Wilharm et al.], simultaneously filed with the present application and corresponding to German Patent Application P 38 11 241.8.

PREPARATION EXAMPLE 5

In this example, the binder is reacted first with a grafting reagent, in addition to the silylation reagent, to modify the alkali solubility of the product produced.

The following substances are weighed in sequence into a 100 ml flask under an atmosphere of argon:
10 g of a cresol/formaldehyde novolak having a softening point of 105° to 120° C., Product from Preparation Example 1

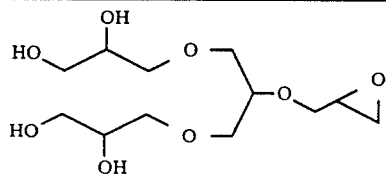

Product from Preparation Example 2

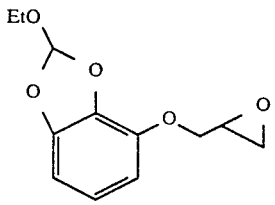

Product from Preparation Example 3

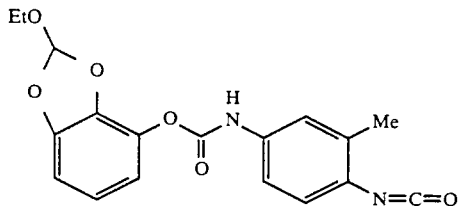

Me = methyl
Et = ethyl

The preparation of the binders claimed according t the invention is described below.

PREPARATION EXAMPLE 4

The following substances are weighed in sequence into a 100 ml flask under an atmosphere of argon:
10 g of a cresol/formaldehyde novolak having a softening point of 147 to 150° C.,
5 g of 2-(pentamethyldisilanyl)ethyl isocyanate,
0.05 g of diazabicyclo[2.2.2]octane in
20 ml of 1,2-dimethoxyethane.

A homogeneous solution is produced after a short time by stirring at room temperature.

The flask is thermostated for 6 h at 60° C. Subsequently, the polymer solution is slowly run into a mixture of 400 ml of methanol and 400 ml of water. The use of a high speed stirring mechanism (IKA stirring mechanism type RE 166) is advantageous for a uniform precipitation.

The precipitated polymer is filtered off by suction with the aid of a glass sintered nutsch filter and dried for 6 h at 90° C. in a vacuum drying oven. The yield is 14.5 g (95% of theory).

The polymer exhibits the following analytical values:
OH number (determined according to DIN 53 240): 204
N content: 2.6%
Si content (elementary analysis): 9.1%
Glass transition temperature: 103° C.

0.92 g of 2,3-epoxypropan-1-ol (glycidol),
0.05 g of diazabicyclo[2.2.2]octane in
30 ml of diethylene glycol dimethyl ether.

A homogeneous solution is produced after a short time by stirring at room temperature.

The flask is thermostated for 6 h at 85° C. Subsequently, the solution is allowed to cool down to room temperature and 5 g of 2-(pentamethyldisilanyl)ethyl isocyanate are added and the solution is thoroughly mixed. Finally, the solution is thermostated for 8 h at 60° C.

The polymer is precipitated in the same manner as described in Preparation Example 4. The yield is 14.6 g (91% of theory).

The polymer exhibits the following analytical values:
OH number (determined according to DIN 53 240): 230
N content: 2.8%
Si content (elementary analysis): 9.0%
Glass transition temperature: 100° C.

PREPARATION EXAMPLE 6

The polymeric binder is prepared and worked up analogously to the manner specified in Preparation Example 4.

The following formulation constituents are used:
10 g of a condensation product of stoichiometric quantities of pyrogallol and acetone having a weight average of the molecular weight of $M_w=1,470$,
8 g of 2-(pentamethyldisilanyl)ethyl isocyanate,
0.08 g of diazabicyclo[2.2.2]octane in 30 ml of 1,2-dimethoxyethane.

The yield is 16.7 g (93% of theory).

The polymer exhibits the following analytical values:
OH number (determined according to DIN 53 240): 277
Si content (elementary analysis): 12.1%

PREPARATION EXAMPLE 7

In the following example, the binder is reacted with two different silylation reagents.

The polymeric binder is prepared and worked up analogously to the manner specified in Preparation Example 4.

The following formulation constituents are used:
10 g of a condensation product of stoichiometric quantities of pyrogallol and acetone having a weight average of the molecular weight of $M_w = 1,470$,
4 g of 2-(pentamethyldisilanyl)ethyl isocyanate,
4 g of (tristrimethylsilyl)silanyl-$\beta$-ethyl isocyanate,
0.08 g of diazabicyclo[2.2.2]octane in
30 ml of 1,2-dimethoxyethane.

The yield is 17.0 g (94% of theory).

The polymer exhibits the following analytical values:
OH number (determined according to DIN 53 240): 315
Si content (elementary analysis): 13.9%

PREPARATION EXAMPLE 8

The polymeric binder is prepared analogously to the manner specified in Preparation Example 4.

The following formulation constituents are used:
10 g of tannin (tannic acid; Riedel-de Haen),
12 g of 2-(pentamethyldisilanyl)ethyl isocyanate,
0.2 g of diazabicyclo[2.2.2]octane in
40 ml of 1,2-dimethoxyethane.

The polymer solution is allowed to slowly run into a mixture of 800 ml of water and 20 ml of 3N hydrochloric acid. The use of a high-speed stirring mechanism (IKA stirring mechanism type RE 166) is advantageous for a uniform precipitation.

The precipitated polymer is filtered off by suction with the aid of a glass sintered nutsch filter and dried in a vacuum drying oven for 6 h at 90° C. The yield is 21.8 g (99% of theory).

The polymer exhibits the following analytical value:
Si content (elementary analysis): 15.0%

PREPARATION EXAMPLE 9

The following example again shows a possibility of reacting the binder also with a grafting agent in addition to the silylation reagent. In this case, grafting is carried out first and then silylation.

The polymeric binder is prepared analogously to the manner specified in Preparation Example 5.

The following formulation constituents are used for the grafting step:
10 g of polyvinylphenol; characterized by a weight average of the molecular weight of $M_w = 4,000$
3.7 g of 2- ethoxy-4-(2',3'-epoxypropyloxy)1,3-benzodioxole,
0.1 g of azabicyclo[2.2.2]octane (quinuclidine) in
30 ml of 2-methyltetrahydrofuran.

The following reagent was used for the silylation step:
5 g of tris(trimethylsilyl)silanyl-$\beta$-ethyl isocyanate.

The polymer solution is allowed to run slowly into a mixture of 800 ml of water, 100 ml of tetrahydrofuran and 20 ml of 36% hydrochloric acid. The use of a high-speed stirring mechanism (IKA stirring mechanism RE 166) is advantageous for uniform precipitation.

The precipitated polymer is filtered off by suction with the aid of a glass sintered nutsch filter and dried for 6 h at 90° C. in a vacuum drying oven. The yield is 17 g (95% of theory).

The polymer exhibits the following analytical value:
Si content (elementary analysis): 9.9%

PREPARATION EXAMPLE 10

The following substances are weighed in sequence into a 100 ml flask under an atmosphere of argon:
10 g of a condensation product of stoichiometric quantities of pyrogallol and acetone having a weight average of the molecular weight of $M_w = 1,470$,
10 g of 4-(2-pentamethyldisilanylethyl)-phenyl 2',3'-epoxypropyl ether,
0.1 g of diazabicyclo[2.2.2]octane in
100 ml of 1,2-dimethoxyethane.

A homogeneous solution is produced after a short time by stirring at room temperature.

The flask is then thermostated at 85° C. for 6 h. The binder is isolated in the following manner: the polymer solution is allowed to slowly run into a mixture of 100 ml of methanol, 700 ml of water and 20 ml of 3N hydrochloric acid. The use of a high-speed stirring mechanism (IKA stirring mechanism type RE 166) is advantageous for a uniform precipitation.

The precipitated polymer is filtered off by suction with the aid of a glass sintered nutsch filter and dried for 6 h at 90° C. in a vacuum drying oven. The yield is 19 g (95% of theory).

The polymer exhibits the following analytical value:
Si content (elementary analysis): 9.0%

PREPARATION EXAMPLE 11

The following substances are weighed in sequence into a 100 ml flask under an atmosphere of argon:
10 g of modified polyvinyl alcohol as described in U.S. Pat. No. 4,374,193, Example 1
12 g of (2,3)-endo-7-anti-pentamethyldisilanylbicyclo[2.2.1]hept-5-ene-2,3-dicarboxylic anhydride in
50 ml of 1,2-dimethoxyethane.

A homogeneous solution is produced after a short time by stirring at 50° C.

Subsequently
0.5 g of triethylamine
is added and thermostating is carried out at 80° C. for 12 h.

To work up the binder, the polymer solution is allowed to run slowly into 800 ml of water. The use of a high-speed stirring mechanism (IKA stirring mechanism type RE 166) is advantageous for a uniform precipitation. The precipitated polymer is filtered off by suction with the aid of a glass sintered nutsch filter and dried for 6 h at 90° C. in a vacuum drying oven. The yield is 21.0 g (95% of theory).

The polymer exhibits the following analytical value:
Si content (elementary analysis): 10.0%

PREPARATION EXAMPLE 12

The following example shows a binder which was silylated with two different silanyl compounds.

The following substances were weighed in sequence into a 100 ml flask under an atmosphere of argon:
10 g of polyvinyl phenol, characterized by a weight average of the molecular weight of $M_w = 4,000$,
7 g of 4-(2-pentamethyldisilanylethyl)phenyl 2'3'-epoxypropyl ether,
0.05 g of diazabicyclo[2.2.2]octane in 40 ml of 1,2-dimethoxyethane.

Thermostating is carried out for 6 h at 85° C. while stirring. Subsequently, 3 g of 2-(pentamethyldisilanyl)-β-propiolactone is added and thermostating is carried out for 36 h at 85° C.

To work up the binder, the polymer solution is allowed to run slowly into 800 ml of water. The subsequent working up is carried out in the manner as described in Preparation Example 11.

The yield is 19.2 g. The polymer exhibits the following analytical value:
Si content (elementary analysis): 10.1%

PREPARATION EXAMPLE 13

The following substances are weighed in sequence into a 100 ml flask under an atmosphere of argon:
10 g of a copolymer of pyrocatechol monomethacrylate and hydroxymethacrylate as described in DE-A-3,528,929,
6 g of bis(2-pentamethyldisilanylethyl)carbodiimide,
30 ml of propylene glycol monomethyl ether acetate (PGMEA).

Thermostating is carried out for 6 h at 60° C. while stirring magnetically. To work up the binder, the polymer solution is allowed to run slowly into 800 ml of hexane. The precipitated polymer is filtered off by suction and dried for 12 h at 90° C. in a vacuum drying oven.

The yield is 15.5 g (97% of theory). The polymer exhibits the following analytical value:
Si content (elementary analysis): 11.2%

PREPARATION EXAMPLE 14

The following formulation constituents are weighed out for the grafting with simultaneous use of a silylating reagent:
10 g of a cresol-formaldehyde novolak having a softening point of 147° to 150° C.,
2 g of N-2-(pentamethyldisilanyl)ethylcarbamic acid 2′,3′-epoxypropyl ester,
3.6 g of triglycerol glycidyl ether, and
0.08 g of diazabicyclo[2.2.2]octane in
30 ml of 2-methyltetrahydrofuran.

Thermostating is carried out for 6 h at 85° C. while stirring magnetically. Subsequently, the following reagent is used for the second silylation:
7 g of tris(trimethylsilyl)silanyl-β-ethyl isocyanate.

Thermostating is carried out for a further 6 h at 60° C. while stirring magnetically. The polymer is precipitated in the same manner as described in Preparation Example 4.

The yield is 21.0 g (3% of theory).
Si content (elementary analysis): 12.4%

PREPARATION EXAMPLE 15

The following formulation constituents are used:
10 g of tannin (tannic acid; Riedel-de-Haen),
18 g of N-(3-methyl-4-isocyanato)phenylcarbamic acid 2-pentamethyldisilanylethyl ester, and
0.2 g diazabicyclo[2.2.2]octane in
50 ml of 1,2-dimethoxyethane.

The reaction and working up are carried out analogously to the manner specified in Preparation Example 8.

The yield is 27.5 g (98% of theory).
Si content (elementary analysis): 10.0%

PREPARATION EXAMPLE 16

The following formulation constituents are used for the silylation step:
10 g of polyvinylphenol characterized by a weight average of the molecular weight of $M_w=4,000$,
15 g of 4-(2-pentamethyldisilanylethyl)phenyl 2′,3′-epoxypropyl ether,
0.1 g of diazabicyclo[2.2.2]octane in
100 ml of 2-methyltetrahydrofuran.

Thermostating is carried out for 12 h at 85° C. while stirring magnetically. Subsequently, the following reagent is used for the grafting step:
3 g of the reaction product of 2-ethoxy-4-hydroxy-1,3-benzodioxole and toluene 2,4-diisocyanate.

Thermostating is carried out for 6 h at 80° C. while stirring magnetically. Working-up is carried out analogously to the manner specified in Preparation Example 8.

The yield is 26.5 g (96% of theory).
Si content (elementary analysis): 9.7%

PREPARATION EXAMPLE 17

The following substances are weighed in sequence into a 250 ml flask under an atmosphere of argon:
10 g of the condensation product of 3-hydroxybenzaldehyde and polyvinyl alcohol whose weight average of the molecular weight $M_w=530$ (literature on the preparation of this condensation product: T. Motoyama and S. Okamura in Kobunshi Kagaku 7, 265 (1950)) and in which less than half of all the hydroxyl groups are acetal-bound,
20 g of ethyl 2-(pentamethyldisilanyl) acetate, and
1 g of tetraethyl titanate in
100 ml of dimethylformamide.

The mixture is thermostated for 24 h at 100° C. To work up the binder, the polymer solution is allowed to slowly run into 1,000 ml of hexane. The use of a high-speed stirring mechanism (IKA stirring mechanism type RE 166) is advantageous for a uniform precipitation. The precipitated polymer is filtered off by suction and dried at 60° C. for 24 h in a vacuum drying oven. 16 g of polymer having a silicon content of 9.5% (determined by elementary analysis) are obtained.

PREPARATION EXAMPLE 18 (COMPARATIVE EXAMPLE)

The polymeric binder is prepared and worked up analogously to the manner specified in Preparation Example 4.

The following formulation constituents are used:
10 g of a cresol-formaldehyde novolak having a softening range of 147° to 150° C.,
3.6 g of 2-(trimethylsilyl)ethyl isocyanate,
0.05 g of diazabicyclo[2.2.2]octane in
20 ml of 1,2-dimethoxyethane.

The yield is 12.8 g (94% of theory). The polymer exhibits the following analytical values:
OH number (determined according to DIN 53 240): 200
Si content (elementary analysis): 5.1%
Glass transition temperature: 100° C.

PREPARATION EXAMPLE 19 (COMPARATIVE EXAMPLE)

The polymeric binder is prepared and worked up analogously to the manner described in Preparation Example 5.

The following formulation constituents are used for the grafting step:
10 g of a cresol-formaldehyde novolak having a softening range of 105° to 120° C.,
0.92 g of 2,3-epoxypropan-1-ol (glycidol),
0.05 g of diazabicyclo[2.2.2]octane in
30 ml o( diethylene glycol dimethyl ether.

The following reagent was used for the silylation step:
3.6 g of 2-(trimethylsilanyl)ethyl isocyanate.

The yield is 13.1 g (90% of theory). The polymer exhibits the following analytical values:
OH number (determined according to DIN 53 240): 230
Si content (elementary analysis): 4.7%
Glass transition temperature: 100° C.

PREPARATION EXAMPLE 20 (COMPARATIVE EXAMPLE)

The following formulation constituents are used:
10 g of tannin (tannic acid; Riedel-de-Haen),
18 g of N-(3-methyl-4-isocyanato)phenylcarbamic acid 2-trimethylsilylethyl ester, and
0.2 g of diazabicyclo[2.2.2]octane in
50 ml of 1,2-dimethoxyethane.

The reaction and working-up are carried out analogously to the manner specified in Preparation Example 15.

The yield is 27 g (96% of theory).
Si content (elementary analysis): 6.0%

PREPARATION EXAMPLE 21 (COMPARATIVE EXAMPLE)

The following formulation constituents are used:
10 g of modified polyvinyl alcohol as described in U.S. Pat. No. 4,374,193, Example 1,
12 g of (2,3)-endo-7-anti-trimethylsilylbicyclo[2.2.1-]hept-5-ene-2,3 dicarboxylic anhydride in
50 ml of 1,2-dimethoxyethane, and
0.5 g of triethylamine.

The reaction and working-up are carried out analogously to the manner specified in Preparation Example 11.

The yield is 21 g (95% of theory).
Si content (elementary analysis): 6.3%

The photoresists prepared with the binders described are summarized below. In the examples, parts by weight (ppw) are to parts by volume (ppv) as g:cm$^3$.

APPLICATION EXAMPLE 1

A photoresist solution is prepared by mixing the following constituents:
11.7 ppw of the binder from Preparation Example 4 and
3.5 ppw of a condensation product of 1,2-naphthoquinone-2-diazide-5-sulfonyl chloride and 2,3,4-trihydroxybenzoquinone in
29.0 ppw of ethyl glycol acetate,
3.1 ppw of butyl acetate, and
3.1 ppw of xylene.

The clear solution produced, which has a solids content of 30%, are filtered through a 0.2 μm filter (Millipore).

The resist solution is spun onto commercial silicon wafers polished as usual and provided with a 0.2 μm thick silicon dioxide layer by oxidation. The layer thicknesses can be adjusted to approximately 1 μm by varying the speed of rotation.

The wafers so coated are dried for 30 minutes at 90° C. in a circulating-air drying oven. After cooling down and conditioning to a specified room climate of 23° C. and 40-50% relative atmospheric humidity, the wafers are exposed to an image with the aid of projection exposure equipment (Canon FPA-1550) through a commercially available mask.

The development is carried out by immersing the exposed copying material in a 1N buffered sodium hydroxide solution with 1% of a wetting agent of the type of an alkoxylated phenol added.

The positive resist image obtained is subjected to reactive oxygen ion etching using the following conditions (Plasmatherm 500):
Oxygen flow rate: 20 cm$^3$/min
Oxygen pressure: 50 mTorr
Irradiated high-frequency power: 200 W A layer thickness measurement is then carried out with a layer thickness measuring apparatus of the type Sloan Dektak II.

After an etching time of 10 minutes, the layer thickness has decreased from initially 1,000 nanometers to 890 nanometers.

As a comparative standard, a film of a cresol novolak of the same softening range as specified above was etched under the same conditions. With a layer thickness initially of 2,000 nanometers, this film had a residual layer thickness of 800 nanometers after 10 minutes under the same etching conditions.

The differential etching rate ratio will be defined by the following equation:

$$\text{Differential etching rate ratio} = \frac{\text{Novolak etching rate (nm/min)}}{\text{Silylated resist etching rate (nm/min)}}$$

The differential etching rate ratio after an etching time of 10 minutes is 10.9.

A positive resist image is furthermore subjected to reactive ion etching with oxygen for a time of 20 minutes under the above-mentioned conditions.

As a comparative standard, use is also made of a film of a cresol novolak of the type described above. The differential etching rate ratio is 15.0 after an etching time of 20 minutes In a further experiment, a wafer is spun-coated with a cresol-formaldehyde resin having a softening range of 147°-150° C. so that a film approximately 2.0 μm thick which is used as a planarization layer results.

The wafer so coated is dried for 30 minutes in a circulating-air drying oven at 90° C. Subsequently, the wafer is heated for 15 minutes at 210° C. in the circulating-air oven. The wafer is allowed to cool down and spun-coated with the above-mentioned resist solution which is diluted so that, on varying the spinning speed, a resist layer thickness of approximately 0.5 μm results after drying. Subsequently, the wafer is dried in a circulating-air oven at 90° C. for 30 minutes. The positive resist image obtained is subjected to reactive oxygen ion etching using the above-cited conditions for a time of 20 minutes. In this process, the positive resist pattern is precisely transferred to the novolak situated thereunder.

APPLICATION EXAMPLE 2 (COMPARATIVE EXAMPLE)

A photoresist solution is prepared by mixing the following constituents:

11.7 ppw of the binder from Preparation Example 18 (comparative example),
3.5 ppw of a condensation product of 1,2-naphthoquinone-2-diazide-5-sulfonyl chloride and 2,3,4-trihydroxybenzoquinone in
29.0 ppw of ethyl glycol acetate,
3.1 ppw of butyl acetate, and
3.1 ppw of xylene.

A positive resist image is obtained using the process steps specified in Application Example 1.

The positive resist image so obtained is subjected to reactive oxygen ion etching using the etching conditions specified in Application Example 1. The differential etching rate ratio is 2.0 after an etching time of 10 minutes. The differential etching rate ratio is 2.2 after an etching time of 20 minutes.

In a further experiment, a wafer is spun-coated with a cresol-formaldehyde resin with a softening range of 147° to 150° C. as described in Application Example 1 so that a film approximately 2.0 μm thick results. The wafer so coated is dried for 30 minutes in a circulating-air drying oven at 90° C. Subsequently, the wafer is heated for 15 minutes at 210° C. in the circulating-air oven. The wafer is allowed to cool down and spun-coated with the resist solution specified above which is so diluted that, on varying the spinning speed, a resist layer thickness of approximately 0.5 μm results after drying. Subsequently, the wafer is dried in a circulating-air oven at 90° C. for 30 minutes. The positive resist image obtained is subjected to reactive oxygen ion etching using the conditions specified above for a time of 20 minutes. After an etching time of 20 minutes, the originally positive resist pattern exhibits severe erosion symptoms. A precise structure transfer is not possible.

APPLICATION EXAMPLE 3

A photoresist solution is prepared by mixing the following constituents:
20.0 ppw of the binder from Preparation Example 5
3.5 ppw of a condensation product of 1,2-naphthoquinone-2-diazide-4-sulfonyl chloride and 2,3,4-trihydroxybenzoquinone in
100.0 ppw propyleneglycol 1-monomethyl ether 2-acetate.

Provided the procedure according to Application Example 1 is adopted, a positive resist image is obtained. The positive resist image so obtained is subjected to reactive oxygen ion etching under the etching conditions specified in Application Example 1. The differential etching rate ratio after an etching time of 10 minutes and 20 minutes is in both cases markedly higher than 10 compared with the cresol novolak cited in Application Example 1.

APPLICATION EXAMPLE 4 (COMPARATIVE EXAMPLE)

A photoresist solution is prepared by mixing the following constituents:
20.0 ppw of the binder from Preparation Example 19, and
3.5 ppw of a condensation product of 1,2-naphthoquinone-2-diazide-4-sulfonyl chloride and 2,3,4-trihydroxybenzoquinone in
100.0 ppw of propyleneglycol 1-monomethyl ether 2-acetate.

A positive resist image is obtained after adopting the procedure according to Application Example 1. The positive resist image so obtained is subjected to reactive oxygen ion etching using the etching conditions specified in Application Example 1. The differential etching rate ratio after an etching time of 10 minutes and 20 minutes is in both cases less than 5 compared with the cresol novolak cited in Application Example 1.

APPLICATION EXAMPLE 5

A photoresist solution is prepared by mixing the following constituents:
20.0 ppw of the binder from Application Example 6, and
5.0 ppw of a condensation product of 1,2-naphthoquinone-2-diazide-5-sulfonyl chloride and 2,3,4-trihydroxybenzoquinone in
100.0 ppw of propyleneglycol 1-monomethyl ether 2-acetate.

A positive resist image is obtained after adopting the procedure according to Application Example 1. The positive resist image so obtained is subjected to the reactive oxygen ion etching using the etching conditions specified in Application Example 1. The differential etching rate ratio after an etching time of 10 minutes and 20 minutes is 37. The differential etching rate ratio after an etching time of 20 minutes is 33.

APPLICATION EXAMPLE 6

A photoresist solution is prepared by mixing the following constituents:
20.0 ppw of the binder from Preparation Example 6, and
2.5 ppw of a condensation product of 1,2-naphthoquinone-2-diazide-5-sulfonyl chloride and 2,3,4-trihydroxybenzoquinone, and
2.5 ppw of a condensation product of 1,2-naphthoquinone-2-diazide-4-sulfonyl chloride and 2,3,4-trihydroxybenzoquinone in
100.0 ppw of propyleneglycol 1-monomethyl ether 2-acetate.

A positive resist image is obtained using the process steps specified in Application Example 1. In this process, a buffered 0.1N sodium hydroxide solution is used as developing solution. The positive resist image so obtained is subjected to reactive oxygen ion etching using the etching conditions specified in Application Example 1. The differential etching rate ratio after an etching time of 10 minutes and 20 minutes is in both cases higher than 30 compared with the cresol novolak cited in Application Example 1.

APPLICATION EXAMPLE 7

This example illustrates the miscibility and compatibility of the binders according to the invention with conventional novolak resins.

A photoresist solution is prepared by mixing the following constituents:
14.0 ppw of the binder from Preparation Example 8,
6.0 ppw of a cresol-formaldehyde novolak with a glass transition temperature of 115° C., and
5.0 ppw of a condensation product of a mixture in the molar ratio of 1:1 of 1,2-naphthoquinone-2-diazide-5-sulfonyl chloride and 1,2-naphthoquinone-2-diazide-4-sulfonyl chloride with 2,3,4-trihydroxybenzoquinone in
100.0 ppw of propyleneglycol 1-monomethyl ether 2-acetate.

Provided the procedure according to the process steps specified in Application Example 1 is adopted, a positive resist image is obtained. In this process, a buffered 0.1N sodium hydroxide solution containing a nonionic surfactant, e.g., a nonylphenol polyglycol ether, is used as a developing solution. The positive resist image so obtained is subjected to reactive oxygen ion etching according to the etching conditions specified in Application Example 1. The differential etching rate ratio after an etching time of 10 minutes and 20 minutes is in both cases higher than 10 compared with the cresol novolak cited in Application Example 1.

APPLICATION EXAMPLE 8

A photoresist solution is prepared by mixing the following constituents:
20.0 ppw of the binder from Preparation Example 6, and
4.0 ppw of 2,6-bis(4,4'-azidobenzal)-4-methylcyclohexane in
40.0 ppw of propyleneglycol 1-monomethyl ether 2-acetate, and
40.0 ppw of xylene.

A negative resist image is produced with this resist solution as follows: a wafer is spun-coated as described in Application Example 1, and dried for 30 minutes in a circulating-air drying oven at 80° C. After cooling, the wafer is exposed with the aid of a contact exposer (K. Suess MJB-3) through a commercially available mask. The unexposed image areas are removed by immersion in methyl isobutyl ketone and subsequently rinsing with isopropanol.

The negative resist image so obtained is subjected to reactive oxygen ion etching according to Application Example 1. The differential etching rate ratio after an etching time of 10 minutes and 20 minutes is in both cases higher than 20 compared with the cresol novolak cited in Application Example 1.

APPLICATION EXAMPLE 9

A photoresist solution is prepared by mixing the following constituents:
20.0 ppw of the binder from Application Example 6,
5.5 ppw of a condensation product of 2-ethylbutyraldehyde and triethylene glycol with a weight average of the molecular weight of $M_w = 1,000$, and
0.5 ppw of 2,4-bis(trichloromethyl)-6-p-methoxystyryl-s-triazine in
100.0 ppw of propyleneglycol 1-monomethyl ether 2-acetate.

A positive resist image is obtained using the process steps specified in Application Example 1. The exposed image areas are removed by immersion in a buffered 0.5N sodium hydroxide solution with 0.5% of a wetting agent of the type of an alkoxylated phenol added. The positive resist image so obtained is subjected to reactive oxygen ion etching according to Application Example 1. The differential etching rate ratio after an etching time of 10 minutes and 20 minutes is in both cases higher than 15 compared with the cresol novolak cited in Application Example 1.

What is claimed is:

1. A silylated polymeric binder derived from a polymer bearing aliphatic or aromatic hydroxyl groups or both aliphatic and aromatic hydroxyl groups, at least a portion of which is modified by groups of the formulae I and II $$[(A-B_n)_mC]-[(D_oE_p)BC]_u- \quad (I)$$

and $$[(D_oE_p)BC]_v- \quad (II),$$

wherein
A denotes a silanyl group containing at least 2 silicon atoms in total linked to each other, but not more than 3 silicon atoms linked to each other in an unbranched chain of silicon atoms;
B denotes a bridging group having the formula IV:

$$-(b_1)_r-(X)-(b_2)_s- \quad (IV)$$

wherein
$b_1$ denotes a $(C_1-C_4)$alkylene of a group containing at least one C—C double bond and resulting from Diels-Alder reaction of an alkadienylene, with a dienophile;
X denotes a single bond, —O—, —S—, —SO$_2$—, —NH—, —NR$^1$—,

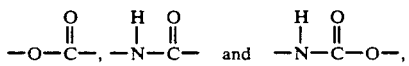

wherein
$R^1$ is a $(C_1-C_3)$alkyl;
$b_2$ denotes arylene or cycloalkylene; and
r, s each denotes 0 or 1, with the proviso that for the bridging group B the sum of the values of r and s is at least 1;
C denotes a group derived from a functional group which has been reacted with a hydroxyl group with formation of a covalent bond
D denotes a di- or polyvalent radical of a mono- or polyhydric aliphatic alcohol;
E denotes a di- or polyvalent radical of a mono- or polyhydric aromatic alcohol;
n denotes 0 or 1;
m denotes 1 or 2; and
o, p, u, and v each denote 0 or 1.

2. A binder as claimed in claim 1, wherein the groups A are silanyl groups of the following formula III

wherein
$a_1$, $a_2$, $a_3$ each independently denote R, —SiR$_3$ and —Si$_2$R$_5$, with the proviso that at least one of $a_1$, $a_2$ or $a_3$ is —SiR$_3$ and not more than one of $a_1$, $a_2$ or $a_3$ is —Si$_2$R$_5$; and each R independently denotes $(C_1-C_3)$alkyl or aryl.

3. A binder as claimed in claim 2, wherein said binder contains silanyl groups which contain no more than three silicon atoms and which contain a methyl group as radical R.

4. A binder as claimed in claim 1, wherein said functional groups forming the basis of the groups C are selected from the group consisting of hydroxyl, amino, epoxy, aziridino, carboxyl, chlorides, amides, anhydrides, lactones, lactams, isocyanate, and carbodiimide.

5. A binder as claimed in claim 1, wherein the grafted functional groups forming the basis of groups D are monohydric or polyhydric aliphatic alcohols having 1-6 hydroxyl groups.

6. A binder as claimed in claim 1, wherein the grafted functional groups forming the basis of groups E are monohydric or polyhydric aromatic alcohols having 1-5 hydroxyl groups.

7. A binder as claimed in claim 1, which is soluble or swellable in aqueous alkali.

8. A binder as claimed in claim 1, which is stable towards radiation of a wavelength greater than 300 nm.

9. A silylated polymeric binder as claimed in claim 1, wherein an aromatic alcohol of group E is derivatized with the C group of the functional unit [(A—$B_n$)$_m$C] by reaction of at least one of its hydroxyl functions.

10. A binder as claimed in claim 2, wherein said radical R denotes a methyl group.

11. A binder as claimed in claim 2, wherein said radical R denotes a phenyl group.

12. A binder as claimed in claim 1, wherein said ($C_1$-$C_4$) alkylene denoting $b_1$ is a $C_2$-alkylene.

13. A binder as claimed in claim 1, wherein said alkadienylene is a cycloalkadienylene containing a total of at least 4 carbon atoms.

14. A binder as claimed in claim 13, wherein said cycloalkadienylene is cyclopentadienyl.

15. A binder as claimed in claim 1, wherein said arylene denoting $b_2$ is naphthylene.

16. A binder as claimed in claim 1, wherein said arylene denoting $b_2$ is phenylene.

17. A binder as claimed in claim 1, wherein said cycloalkylene is cyclohexylene.

18. A binder as claimed in claim 1, wherein said arylene is further substituted by ($C_1$-$C_3$)alkyl or ($C_1$-$C_3$)alkoxy.

19. A binder as claimed in claim 1, wherein said arylene is further substituted by a methyl group and is joined in the ortho position to the bond which carries the functional group.

20. A binder as claimed in claim 4, wherein said epoxy group is bound via an alkylene group.

21. A binder as claimed in claim 20, wherein said alkylene group is a methyleneoxa.

22. A binder as claimed in claim 5, wherein said aliphatic alcohol is etherified with further alcohols on all but one of its hydroxyl groups.

23. A binder as claimed in claim 6, wherein said aromatic alcohol has at least 3 hydroxyl groups.

* * * * *